(12) United States Patent
Zhang et al.

(10) Patent No.: US 12,248,347 B2
(45) Date of Patent: *Mar. 11, 2025

(54) SERIES CIRCUIT AND COMPUTING DEVICE

(71) Applicant: Hangzhou Canaan Intelligence Information Technology Co, Ltd, Hangzhou (CN)

(72) Inventors: Nangeng Zhang, Hangzhou (CN); Min Chen, Hangzhou (CN)

(73) Assignee: HANGZHOU CANAAN INTELLIGENCE INFORMATION TECHNOLOGY CO, LTD, Hangzhou (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/321,332

(22) Filed: May 22, 2023

(65) Prior Publication Data
US 2023/0288972 A1    Sep. 14, 2023

Related U.S. Application Data

(63) Continuation of application No. 17/563,898, filed on Dec. 28, 2021, now Pat. No. 11,698,670, which is a (Continued)

(51) Int. Cl.
    *G06F 1/26*     (2006.01)
    *H03K 19/0185*     (2006.01)

(52) U.S. Cl.
    CPC ............ *G06F 1/26* (2013.01); *H03K 19/0185* (2013.01)

(58) Field of Classification Search
    CPC ............................ G06F 1/26; H03K 19/0185
See application file for complete search history.

(56) References Cited

U.S. PATENT DOCUMENTS

| 9,116,692 B1 | 8/2015 | Krein et al. |
| 2004/0107334 A1 | 6/2004 | Hatte |

(Continued)

FOREIGN PATENT DOCUMENTS

| CN | 201373062 Y | 12/2009 |
| CN | 103576814 A | 2/2014 |

(Continued)

OTHER PUBLICATIONS

Chinese Intellectual Property Office, Search Report in Chinese Application CN201611016699.6, Nov. 18, 2016, 3 pages.

*Primary Examiner* — Henry Tsai
*Assistant Examiner* — Aurangzeb Hassan
(74) *Attorney, Agent, or Firm* — MUNCY, GEISSLER, OLDS & LOWE, P.C.

(57) ABSTRACT

A series circuit and a computing device include a power supply terminal for providing voltage for a plurality of chips disposed on the computing device; a ground terminal disposed at one end of each of the plurality of chips relative to the power supply terminal; and a first connection line for separately connecting a first predetermined number of chips of the plurality of chips in series, wherein a communication line is connected between adjacent chips of the first predetermined number of chips, a portion of the communication line is connected to a target connection point, which is disposed on the first connection line and adapted to the adjacent chips, via a third connection line, and the voltage at the target connection point is greater than or equal to the minimum voltage required for communication between the adjacent chips.

34 Claims, 4 Drawing Sheets

Related U.S. Application Data continuation of application No. 15/993,124, filed on May 30, 2018, now Pat. No. 11,243,588.

(56) References Cited

U.S. PATENT DOCUMENTS

| | | |
|---|---|---|
| 2008/0001625 A1 | 1/2008 | Hwang et al. |
| 2009/0021955 A1 | 1/2009 | Kuang et al. |
| 2010/0185784 A1* | 7/2010 | De Nie .............. G06F 13/4291 |
| | | 714/E11.146 |
| 2014/0277802 A1 | 9/2014 | Tomas et al. |
| 2015/0270727 A1 | 9/2015 | Fukute et al. |
| 2015/0288220 A1 | 10/2015 | Gurunathan et al. |
| 2016/0043555 A1 | 2/2016 | Howell |
| 2016/0254744 A1 | 9/2016 | Andry et al. |
| 2016/0303478 A1 | 10/2016 | Binder |
| 2017/0169220 A1 | 6/2017 | Fish et al. |

FOREIGN PATENT DOCUMENTS

| | | |
|---|---|---|
| CN | 104081312 A | 10/2014 |
| CN | 105045364 A | 11/2015 |

* cited by examiner

SERIES CIRCUIT AND COMPUTING DEVICE

This application is a Continuation application of U.S. patent application Ser. No. 17/563,898, filed on Dec. 28, 2021, and entitled "Series Circuit and Computing Device, which is a Continuation application of U.S. patent application Ser. No. 15/993,124, filed on May 30, 2018, now U.S. Pat. No. 11,243,588, the entire contents of all of which are incorporated herein by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

TECHNICAL FIELD

The present invention relates to the field of computer technology, and particularly to a series circuit for a computing device and a computing device for mass computation.

BACKGROUND ART

With the development of artificial intelligence, machine learning, and Big Data technology, the device performance requirements have increased. Traditional central processing units (CPUs) and graphics processing units (GPUs) have been incapable of meeting the requirements in terms of computing performance, while field-programmable gate arrays (FPGAs) and application specific ICs (ASICs) are increasingly getting attention due to their high performance, low power consumption, and miniaturization.

In such IC chip devices, however, a plurality of processing chips are generally arranged in a parallel computing manner to improve computing performance. As the energy consumption density increases, the operating current of the chip increases while the operating voltage decreases. Therefore, a relatively complicated transformer design is required to enable it to operate under a positive voltage. Nevertheless, the deployment process is complicated and the cost is relatively high.

In addition, some enterprises have applied series power supply circuits, for example, the Chinese patent application No. 201510432510.0 relates to a series power supply circuit, a virtual digital coin mining machine and a computer server, disclosing that the main solution is to connect signal level conversion units in series among the various chips to be powered. The signal level conversion unit may employ an optic-coupling conversion method, a transformer conversion method, a differential signal transmission method, and/or a diode voltage drop method. However, The IO of the chip needs to be connected by setting a plurality of components or separate chips, which results in a high chip-manufacturing cost and reduces the stability of the chip circuit.

In summary, when multiple computing units (chips) are powered by a series circuit, the following two problems may arise:

First, each chip may divide the power supply voltage equally. The voltage of each chip can only support its own operation. Communication between the chips requires a higher voltage. Only one power supply cannot satisfy the communication between the chips.

Second, communication between the chips can only be carried out at the same voltage, so it is necessary to ensure the consistency of the voltage between the two chips.

For the first problem, the usual practice is to connect an auxiliary power supply for each chip. If household or enterprise electricity is used as an auxiliary power supply, a large number of power interfaces are needed. Normally, batteries are used as auxiliary power supplies to ensure that the voltage of each chip satisfies the voltage required for its communication with other chips. However, the voltage of the batteries attenuates with the output of the current, so the voltage of each battery may be different, and there is no guarantee that the voltages between the chips are the same.

For the second problem, an auxiliary power supply cannot guarantee the same voltage between the chips, and it is necessary to further add a signal level conversion device between two adjacent chips or connect a voltage regulator to each chip to ensure that the voltage of each chip is the same. By doing so, communication between the chips in a series circuit can be enabled.

However, the existing solutions either require a number of batteries or require a number of signal level conversion devices or voltage regulators, making the circuit structure complex and the manufacturing cost is high. How to simplify the deployment process and reduce the cost by improving the circuit structure between the chips is a technical problem urgent to be solved in the present invention.

DISCLOSURE OF THE INVENTION

It is an objective of the present invention to provide a series circuit that simplifies a computing device deployment process of and reduces the manufacturing cost.

To achieve the above objective, the present invention provides a series circuit, comprising:
  a power supply terminal;
  a ground terminal;
  a plurality of chips connected between the power supply terminal and the ground terminal in series, and at least one of the chips have a signal input terminal and a signal output terminal;
  a first connection line electrically connected between a first chip and a second chip of adjacent chips, and the first connection line having a first voltage;
  a second connection line connected between the first connection line and the signal input terminal or the signal output terminal of a third chip; wherein the first voltage is greater than or equal to a preset voltage.

It is another objective of the present invention to provide a computing device, comprising:
  a plurality of chips, and at least one of the chips have a signal input terminal and a signal output terminal;
  a series circuit, further comprising:
  a power supply terminal;
  a ground terminal;
  the chips connected between the power supply terminal and the ground terminal in series;
  a first connection line electrically connected between a first chip and a second chip of adjacent chips, and the first connection line having a first voltage;
  a second connection line connected between the first connection line and the signal input terminal or the signal output terminal of a third chip; wherein the first voltage is greater than or equal to a preset voltage.

The beneficial effect of the present invention is that: a communication line and a connection line can be connected to a connection point for providing a communication voltage to an adjacent chip, so that the voltage required for communication can be provided for the adjacent chips, and the direct connection between the voltage and the communication line is connected to the adjacent chips guarantees that the voltages between the chips remain the same; there is no need to provide auxiliary power supply for each chip or to use a number of signal level conversion devices, thereby reducing the costs.

Additional features and advantages of the present invention will be further described in the embodiments below, and will partially become apparent from the specification, or may be learned by practice of the present invention. The objectives and other advantages of the present invention may be achieved and attained by virtue of the structure particularly indicated in the written specification, claims and drawings.

The technical solution of the present invention will be further described in detail below with reference to the accompanying drawings and embodiments.

Figure 1A:
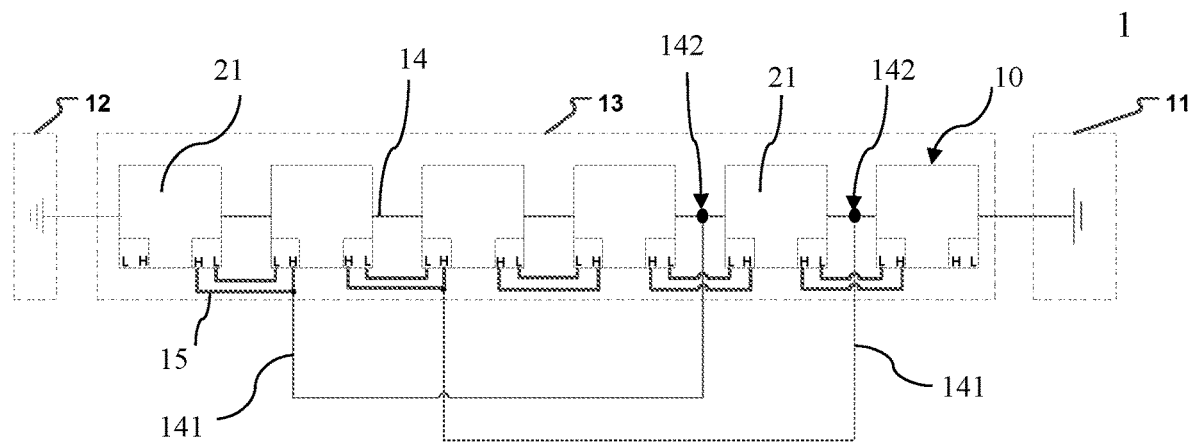
FIG. 1A is a schematic diagram showing the structure of a series circuit according to an embodiment of the present invention.

Therein, the drawing reference signs are as follows:
1—Computing device
10—A plurality of Chips for processing
11—Power Supply Terminal
12—Ground Terminal
13—First Predetermined Number of Chips
14—First Connection Line
141—Third connection line
142—Target Connection Point
15—Communication Line
15'—Target Connection line
21—chips (processing Unit)
211—Signal Input Terminal
2111—Pull-Down Resistor
212—Signal Output Terminal
2121—Open-Drain Circuit
31—Regulator

EMBODIMENTS

Hereinafter, the preferred embodiments of the present invention will be described with reference to the accompanying drawings. It will be appreciated that the preferred embodiments described herein are only used for illustrating and explaining the present invention and are not intended to limit the present invention. In addition, it should be noted that in the description of the present invention, the orientations or positional relations indicated by the terms "horizontal", "longitudinal", "upper", "lower", "front", "back", "left", "right", and "vertical", "horizontal", "top", "bottom", "inner" and "outer", etc., are based on the orientation or positional relations shown in the drawings and are merely for ease of depiction of the present invention and for simplified descriptions, but they do not indicate or imply that the device or element referred to must have a specific orientation, or is configured and operated in a specific orientation, and therefore should not be construed to limit the present invention.

Figure 1B:
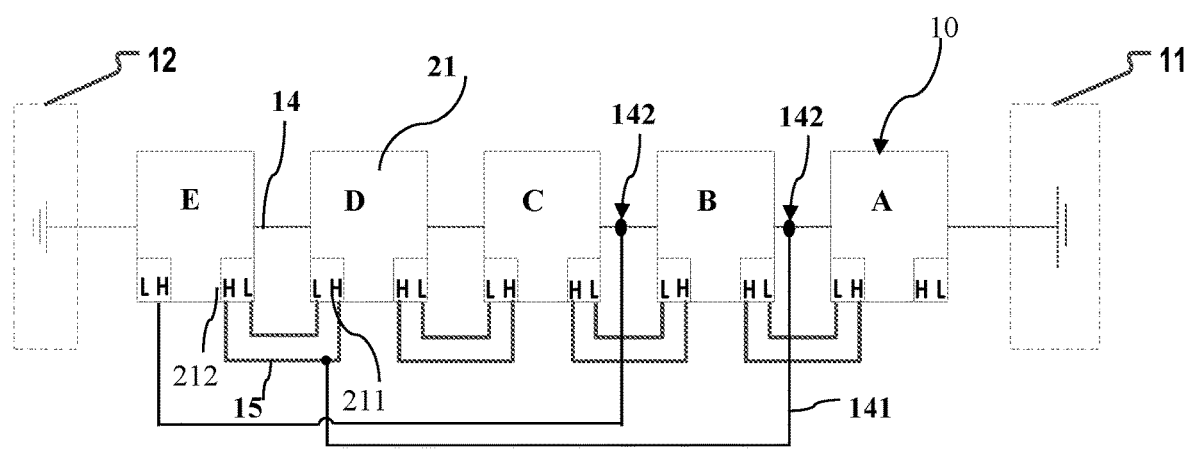
FIG. 1B is a schematic diagram showing the structure of a series circuit according to an embodiment of the present invention.

FIGS. 1A and 1B are each a schematic diagram showing the structure of a series circuit according to an embodiment of the present invention. As shown in FIGS. 1A and 1B, the series circuit comprises: a power supply terminal 11 for providing voltage for a plurality of chips 21 (processing Units) connected in series via a first connection line 14, at the other end of each of the plurality of serially connected chips 21 being a ground terminal 12; wherein the plurality of the chips 21 are selected as the first predetermined number of chips 13, and are connected one by one via a first connection line 14; In series, a communication line 15 as a second connection line for signal transmission is connected between any adjacent chips 21 of the first predetermined number of chips 13. Of the two adjacent chips 21, a signal input terminal 211 of the previous chip 21 is connected to a signal output terminal 212 of the next chip 21 via the communication line 15. Similarly, a signal output terminal 212 of the previous chip 21 is connected to a signal input terminal 211 of the next chip 21 via the communication line 15. In addition, a target connection point 142 is disposed on the first connection line 14 so that the voltage at the target connection point 142 is greater than or equal to the minimum voltage required for communication of the adjacent chips 21 that are adapted. To this end, the communication line 15 is connected to the target connection point 142 via a third connection line 141 so as to guarantee the voltage to which the transmission signal between the adjacent chips 21 is adapted.

In this embodiment, the deployment process is simplified by changing the circuit structure between the chips to a series circuit, thus there is no need for a complicated transformer design, i.e., no need for a number of transformer devices to ensure the operating voltage of the chips.

In FIGS. 1A and 1B, in such series connection manner, the communication line 15 is connected to the target connection point 142 capable of providing a communication voltage for the adjacent chips 21 on the first connection line 14 via the third connection line 141, so as to provide the adjacent chips 21 with the voltage required for signal communication. Because the voltage is directly connected to the communication line 15 connecting the adjacent chips 21 via the third connection line 141, a plurality of chips 10 for mass computation on the computing device 1 are enabled to have the same voltage. Secondly, since the target connection point 142 is located on the first connection line 14 of the series power supply circuit, the circuit structure only requires one power supply, which can not only provide the voltage required for the operation of the plurality of chips 21, but also provide the communication voltage between the adjacent chips 21, which realizes the multiplexing of the power supply and simplifies the circuit structure. Further, since there is no need to provide an auxiliary power supply for each chip or to use a number of signal level conversion devices, the cost for manufacturing the computing device 1 is further reduced.

In the embodiments of the present invention, dozens or hundreds of chips 10 for performing operations are provided on the computing device 1. In the embodiment shown in FIG. 1B, five chips 21 are taken as an example for description, wherein chip A, chip B, chip C, chip D, and chip E, for example, are connected to a series circuit in sequence. Therein, chip A is connected to the power supply terminal 11 at the right end, chip E is connected to the ground terminal 12 at the left end, and the power supply terminal 11 provides a voltage of 5V, so the voltage difference between the left and right ends of each chip 21 is 1V, the voltage at the right end of chip A is 5V and the voltage at the left end thereof is 4V; the voltage at the right end of chip B is 4V and the voltage at the left end thereof is 3V; the voltage at the right end of chip C is 3V and the voltage at the left end thereof is 2V; the voltage at the right end of chip D is 2V and the voltage at the left end thereof is 1V; the voltage at the right end of chip E is 1V and the voltage at the left end thereof is 0V. In this moment, the voltage difference between the chips is 1V, and only the voltage required for the operation of the chip 21 can be provided, while the voltage of 1V cannot support the signal communication between the adjacent chips 21. Assume that the signal communication voltage required by the chips 21 is 3V, and communication between chip D and chip E is taken as an example. Since the voltage at the left end of chip A is 4V and the voltage at the right end of chip B is 4V, the voltage value between chips A and B is 4V; in a similar fashion, the voltage value between chip B and chip C is 3V, and the voltage value between chip C and chip D is 2V. Thus, both the first connection line 14 between chips A and B and the first connection line 14 between chips B and C can provide the voltage required for communication between chip D and chip E. It therefore can be selected that the target connection point 142 adapted to the adjacent chips D and E is located on the first connection line 14 between chip A and chip B or between chip B and chip C. When the communication line 15 between chip D and chip E is connected to the target connection point 142 on the first connection line 14 between chip B and chip C via the third connection line 141, a voltage of 3V can be provided for the communication between chip D and chip E, which is exactly the minimum voltage required for communication between chip D and chip E; when the communication line 15 between chip D and chip E is connected to the target connection point 142 on the first connection line 14 between chip A and chip B via the third connection line 141, a voltage of 4V can be provided for communication between chip D and chip E.

The beneficial effects of the present invention are: the communication line is connected to the connection point capable of providing a communication voltage for the adjacent chips on the connection line, so that a voltage required for communication can be provided for the adjacent chips, and the direct connection between the voltage and the communication line connected to the adjacent chips guarantees that the voltages between the chips are the same; there is no need to provide an auxiliary power supply for each chip or to use a number of signal level conversion devices, thereby reducing costs.

Figure 2A:
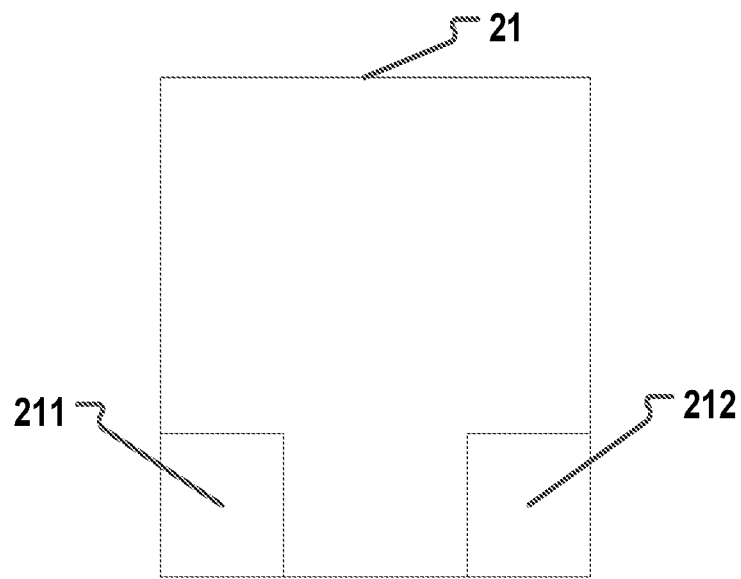
FIG. 2A is a schematic diagram showing the structure of a chip according to an embodiment of the present invention.

In another embodiment of the present invention, as shown in FIG. 2A, the chip 21 includes: a signal input terminal 211 for receiving a signal sent from the previous adjacent chip 21; and a signal output terminal 212 for sending a signal to the next adjacent chip 21, thereby enabling signal communication between the chips 21. In this embodiment, the chip 21 includes both the signal input terminal 211 and the signal output terminal 212. Therefore, the same chip can both receive signals and send signals, so that the chip 10 in the series circuit can perform bidirectional communication.

Figure 2B:
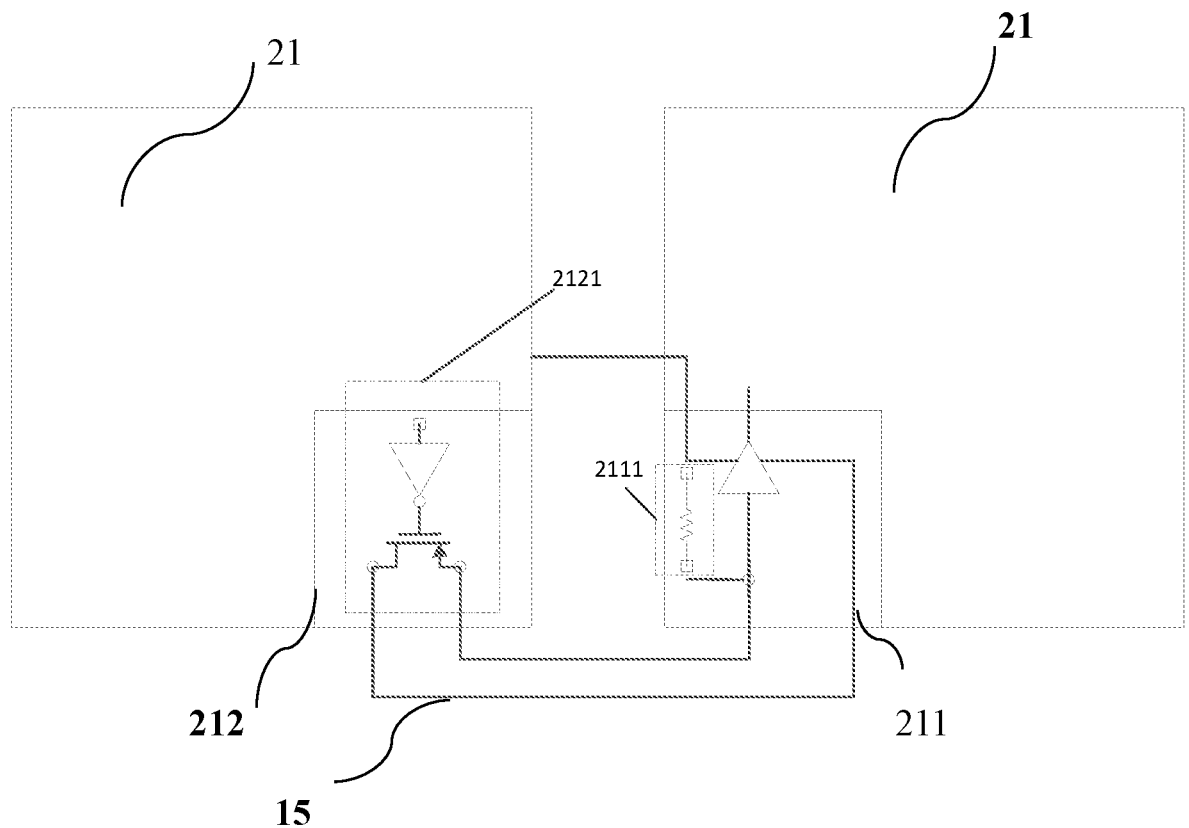
FIG. 2B is a schematic diagram showing the connection between a signal output terminal of the previous chip and a signal input terminal of the next chip in an embodiment of the present invention.
Figure 2C:
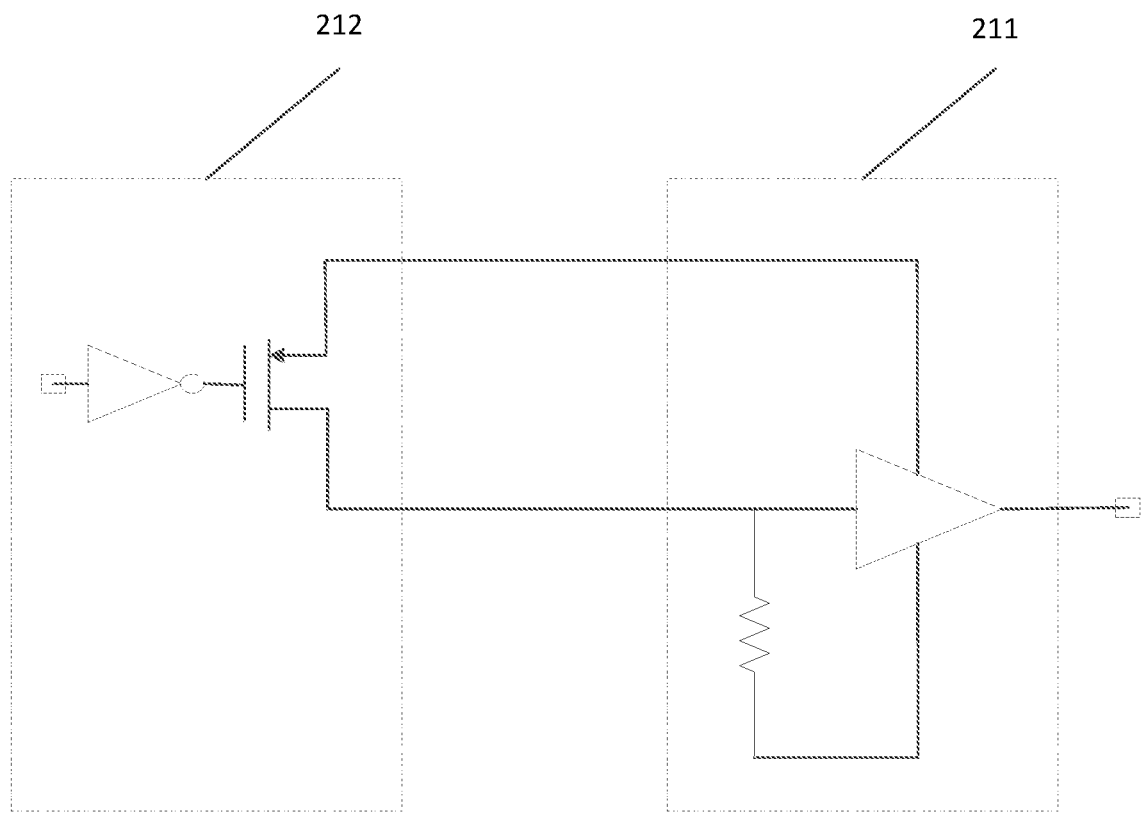
FIG. 2C is a schematic diagram showing the connection between a signal output terminal of the previous chip and a signal input terminal of the next chip in an embodiment of the present invention.

FIGS. 2B and 2C are schematic diagrams showing the connection between the signal output terminal 212 of the previous chip and the signal input terminal 211 of the next chip of the two chips 21. In the embodiment shown in FIG. 2B, the signal output terminal 212 uses an open-drain circuit 2121, the signal input terminal 211 is connected with an external pull-down resistor 2111. Therefore, the output voltage is determined by the pull-down resistor 2111 of the signal input terminal 211, so it can flexibly adapt to different voltage ranges.

In another embodiment of the present invention, the signal input terminal 211 of the chip 21 is further provided with an input buffer for receiving a communication signal sent from the previous adjacent chip; the signal output terminal 212 of the chip 21 is also provided with an output buffer for buffering the signal sent to a next adjacent chip.

In this embodiment, the signal input terminal 211 of the chip includes an input buffer for receiving a signal sent from the previous adjacent chip; the signal output terminal 212 of the chip includes an output buffer for buffering a signal sent to the next adjacent chip.

When the signal is input to the chip 21 from the previous chip to the chip 21, if the signal corresponds to a relatively large amount of data, the chip 21 may take a long time to process the data to which the signal corresponds. However, when the signal needs to be output to the next chip adjacent to the chip 21, in order to achieve a less time difference or a zero-time difference, buffers are arranged for both the signal input terminal 211 and the signal output terminal 212 in the embodiment of the present invention. When the chip 21 receives the signal input by the previous adjacent chip, it first reads and processes a part of the signal from the input buffer, and at this time, the signal in the input buffer is put into the output buffer, waiting to be output to the next adjacent chip. Meanwhile, the corresponding data of remaining signals is processed. As such, after the signal in the output buffer is completely output, the processing of the data to which the remainder of the signal corresponds is completed as well, and then the data to which the remainder of the signal corresponds can be output. If there is no buffer, signal transmission will be stuck. With such a design, the next chip adjacent to the chip 21 can receive a portion of data within a short time and process that portion of data without waiting for the complete output of the chip 21 before receiving the data. Thus, the communication efficiency among all the operational chips 10 is improved.

Figure 3:
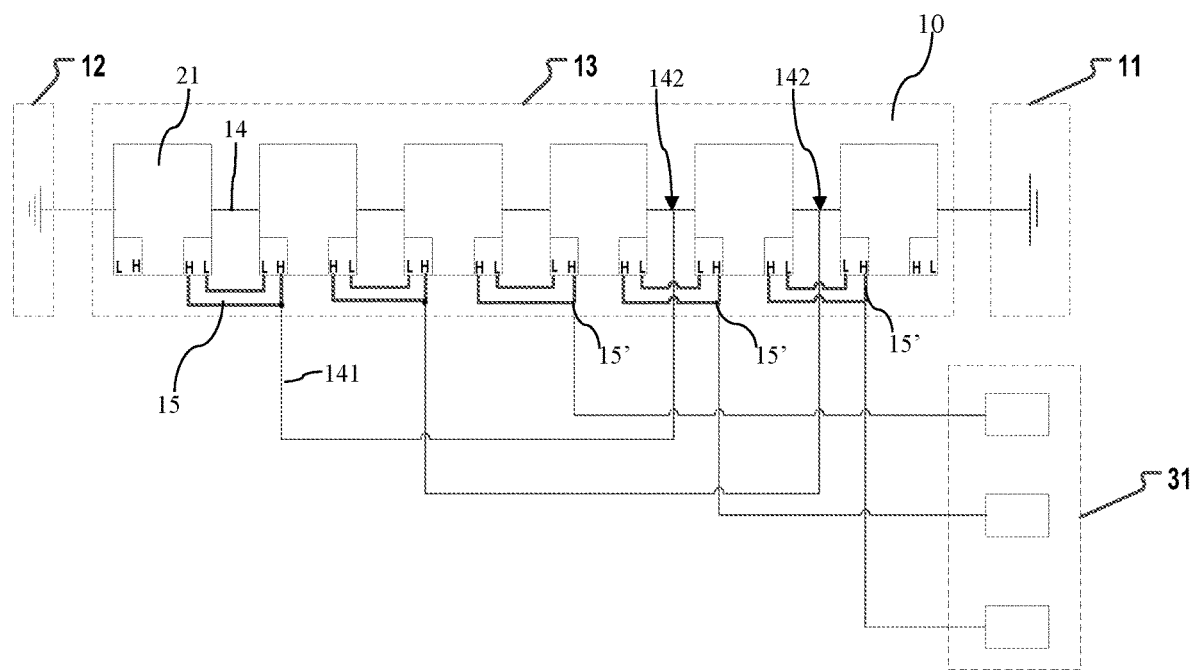
FIG. 3 is a schematic diagram showing the structure of a series circuit in an embodiment of the present invention.

In another embodiment of the present invention as shown in FIG. 3, the series circuit may further comprise: voltage regulators 31 for respectively connecting with a plurality of target communication lines 15', wherein the target communication lines 15' is connected to an adjacent chip 21 free of an adaptive target connection point 142. In this embodiment, some adjacent chips 21 are free of an adaptive target connection point 142. In this case, voltage regulators 31 need to be connected so that the signal input terminals 211 and the signal output terminals 212 of the chips 21 are regulated to their nominal operating voltage. For example, in the embodiment as shown in FIG. 1A, none of the two chips 21 connected with the first target communication line 15' near the power supply terminal 12, the two chips 21 connected with the second target communication line 15', and the two chips 21 connected with the third target communication line 15' have an adaptive target connection point 142.

As shown in FIG. 3, the three target communication lines 15' are separately connected to the voltage regulators 31, so that the signal input terminals 211 and the signal output terminals 212 of the chips 21, to which the three target communication lines 15' are respectively connected, are regulated to their nominal operating voltage, ensuring normal communication between the chips 21. The beneficial effect of this embodiment lies in that when there are adjacent chips 21 that do not have an adaptive target connection point, the voltage regulators 31 are arranged to connect the target communication line 15' between the adjacent chips to ensure the normal communication between adjacent chips, further ensuring the normal communication among all the chips 10.

In another embodiment of the present invention, the voltage regulators 31 are used to be connected to the target communication lines among a second predetermined number of chips 21 near the power supply terminal 1, and the second predetermined number may have a value of 3, 4 or 5. In this embodiment, it can be seen from any of FIG. 1A, FIG. 1B, or FIG. 3 that none of the two chips 21 connected with the first target communication line 15' near the power supply terminal 11, the two chips 21 connected with the second target communication line 15', and the two chips 21 connected with the third target communication line 15' have an adaptive target connection point 142. Thus, the three target communication lines 15' are respectively connected to the voltage regulators 31, which can not only ensure that there is no adaptive target connection point 142 between the adjacent chips 21 but also guarantee the communication voltage between the adjacent chips 21. In the embodiment of the present invention, the voltage regulators 31 are disposed only among several adjacent chips 21 close to the power supply terminal 11, which, on the basis of ensuring normal communication of all the chips 10, saves a number of voltage regulators, thereby reducing the implementation difficulty and cost of the technical solution of the present invention.

This embodiment of the present invention has a significant beneficial effect. By respectively connecting only part of the voltage regulators 31 to the target communication lines 15' among the second predetermined number (e.g., 3-5) of chips near the power supply terminal 11, it is thus not necessary to provide the voltage regulators 31 for all the communication lines 15 among the chips 10, and it is only necessary to provide voltage regulators for the chips close to the power supply, which reduces the difficulty of implementation and reduces the cost.

In another embodiment of the present invention, among a plurality of chips there are adjacent chips 21 that are adapted to a plurality of target connection points 142, wherein the communication lines 15 among the adjacent chips that are closer to the ground terminal 12 are connected to the target connection points 142 that are closer to the ground terminal 12.

In another embodiment of the present invention, the series circuit disclosed in the various embodiments described above is applied to a computing device 1, which may be a computing board for mining virtual digital currency. The computing board further comprises chips 10 for performing operations. There may be dozens or hundreds of such chips, and they are selected according to the needs of the mining machine. Of course, the computing device of the present invention may also be a computing device used in the technical fields of artificial intelligence, machine learning, or mass data processing, etc., and the computing chip as an processing Unit may be a GPU, an FPGA, an ASIC, a KPU, or the like as processing Unit.

In another embodiment of the present invention, a mining machine employing the computing board is used. The mining machine includes a control board, a connection board, a computing board and a radiator with a fan, wherein the computing board is connected to the control board via the connection board and is arranged on one side or in the middle of the radiator, the control board and the connection board are fixed on a rack, and dozens or hundreds of the processing Units are provided on the computing board.

Certain terms are used throughout the present specification and the following claims to refer to the specific components. Those of ordinary skills in the art should understand that manufacturers may use different terms to refer to the same component. In the present specification and the following claims, components are not differentiated by their difference in name, but instead are differentiated by their difference in function. The terms "including" and "comprising" mentioned throughout the specification and subsequent claims are open-ended terms and thus should be interpreted as "comprising but not limited to".

Although the embodiments of the present invention have been disclosed as above, it is not limited to the applications listed in the specification and the embodiments, and it can be fully applied to various fields fit for the present invention. It will be apparent to those skilled in the art that various modifications and variations can be made to the present invention without departing from the spirit and scope of the present invention. As such, if these modifications and variations of the present invention fall within the scope of the claims of the present invention and their equivalents, the present invention is also intended to include these modifications and variations.

The invention claimed is:

1. A series circuit, comprising:
    a power supply terminal;
    a ground terminal;
    a plurality of chips connected between the power supply terminal and the ground terminal in series, and at least one of the chips has a signal input terminal and a signal output terminal;
    a first connection line electrically connected between a first chip and a second chip of adjacent chips, and the first connection line having a first voltage; and
    a second connection line connected between the first connection line and the signal input terminal or the signal output terminal of a third chip,
    wherein the first voltage is greater than or equal to a preset voltage and the preset voltage is the minimum voltage required by the plurality of chips for communication; and the series circuit further comprises communication lines connected between the signal input terminal of a previous chip and the signal output terminal of a next chip.

2. The series circuit according to claim 1, wherein the signal input terminal or the signal output terminal of the third chip receives auxiliary power supply from the second connection line.

3. The series circuit according to claim 1, wherein the previous chip is adjacent to the next chip.

4. The series circuit according to claim 1, wherein the preset voltage is the minimum voltage required by the communication lines for communication.

5. The series circuit according to claim 1, wherein at least one of the chips comprises a plurality of subchips, and the plurality of subchips are connected in series or in parallel.

6. The series circuit according to claim 1, wherein the third chip that is closer to the ground terminal is connected to the first connection line that is closer to the ground terminal via the second connection line.

7. The series circuit according to claim 1, wherein
the signal output terminal comprises at least one open-drain circuit, and
the signal input terminal comprises at least one external pull-down resistor.

8. The series circuit according to claim 7, wherein
the signal input terminal further comprises an input buffer; and
the signal output terminal further comprises an output buffer.

9. The series circuit according to claim 8, wherein a power terminal of the input buffer is connected to the second connection line.

10. The series circuit according to claim 8, wherein a ground terminal of the input buffer is connected to the first connection line.

11. The series circuit according to claim 8, wherein a power terminal of the output buffer is connected to the second connection line.

12. The series circuit according to claim 8, wherein a ground terminal of the output buffer is connected to the first connection line.

13. The series circuit according to claim 7, wherein the open-drain circuit comprises an inverter and a switch unit, and the inverter and the switch unit are connected in series.

14. The series circuit according to claim 13, wherein the switch unit comprises a transistor, an output of the inverter is connected to a gate of the transistor, a source/drain of the transistor is connected to the first connection line and a drain/source of the transistor is configured to output signals.

15. The series circuit according to claim 1, further comprising:
a voltage regulator configured to provide a regulated power supply to at least a subset of the plurality of chips.

16. The series circuit according to claim 15, wherein the at least subset of the plurality of chips include multiple chips, and the voltage regulator is configured to provide a regulated power supply to each of the at least subset of the plurality of chips.

17. The series circuit according to claim 16, wherein a number of the at least subset of the plurality of chips is 3, 4 or 5.

18. A computing device, comprising:
a plurality of chips, and at least one of the chips has a signal input terminal and a signal output terminal; and
a series circuit comprising:
a power supply terminal;
a ground terminal, the chips being connected between the power supply terminal and the ground terminal in series;
a first connection line electrically connected between a first chip and a second chip of adjacent chips, and the first connection line having a first voltage; and
a second connection line connected between the first connection line and the signal input terminal or the signal output terminal of a third chip,
wherein the first voltage is greater than or equal to a preset voltage and the preset voltage is the minimum voltage required by the plurality of chips for communication; and the computing device comprises communication lines connected between the signal input terminal of a previous chip and the signal output terminal of a next chip.

19. The computing device according to claim 18, wherein the signal input terminal or the signal output terminal of the third chip receives auxiliary power supply from the second connection line.

20. The computing device according to claim 18, wherein the previous chip is adjacent to the next chip.

21. The computing device according to claim 18, wherein the preset voltage is the minimum voltage required by the communication lines for communication.

22. The computing device according to claim 18, wherein at least one of the chips comprises a plurality of subchips, and the plurality of subchips are connected in series or in parallel.

23. The computing device according to claim 18, wherein the third chip that is closer to the ground terminal is connected to the first connection line that is closer to the ground terminal via the second connection line.

24. The computing device according to claim 18, wherein
the signal output terminal comprises at least one open-drain circuit, and
the signal input terminal comprises at least one external pull-down resistor.

25. The computing device according to claim 24, wherein
the signal input terminal further comprises an input buffer; and
the signal output terminal further comprises an output buffer.

26. The computing device according to claim 25, wherein a power terminal of the input buffer is connected to the second connection line.

27. The computing device according to claim 25, wherein a ground terminal of the input buffer is connected to the first connection line.

28. The computing device according to claim 25, wherein a power terminal of the output buffer is connected to the second connection line.

29. The computing device according to claim 25, wherein a ground terminal of the output buffer is connected to the first connection line.

30. The computing device according to claim 24, wherein the open-drain circuit further comprises an inverter and a switch unit, and the inverter and the switch unit are connected in series.

31. The computing device according to claim 30, wherein the switch unit comprises a transistor, an output of the inverter is connected to a gate of the transistor, a source/drain of the transistor is connected to the first connection line and a drain/source of the transistor is used to output signals.

32. The computing device according to claim 18, further comprising:
a voltage regulator configured to provide a regulated power supply to at least subset of the plurality of chips.

33. The computing device according to claim 32, wherein the at least subset of the plurality of chips include a plurality of chips, and the voltage regulator is configured to provide a regulated power supply to each of the at least subset of the plurality of chips.

34. The computing device according to claim 33, wherein a number of the at least subset of the plurality of chips is 3, 4 or 5.

* * * * *